United States Patent
Shields et al.

[11] Patent Number: 6,066,546
[45] Date of Patent: May 23, 2000

[54] METHOD TO MINIMIZE PARTICULATE INDUCED CLAMPING FAILURES

[75] Inventors: Jeffrey A. Shields, Sunnyvale; Anne E. Sanderfer, Campbell, both of Calif.

[73] Assignee: Advanced Micro Devices, Inc., Sunnyvale, Calif.

[21] Appl. No.: 09/227,644

[22] Filed: Jan. 8, 1999

[51] Int. Cl.[7] .................................................. H01L 21/322
[52] U.S. Cl. ........................... 438/471; 438/905; 438/906
[58] Field of Search .................................... 438/471, 905, 438/906

[56] References Cited

U.S. PATENT DOCUMENTS

| | | | |
|---|---|---|---|
| 5,434,090 | 7/1995 | Chiou | 438/471 |
| 5,603,892 | 2/1997 | Grilletto | 422/3 |
| 5,707,498 | 1/1998 | Ngan | 204/192.12 |
| 5,746,928 | 5/1998 | Yen | 216/37 |
| 5,865,896 | 2/1999 | Nowak | 118/723 |

*Primary Examiner*—Charles Bowers
*Assistant Examiner*—Nema Berezny
*Attorney, Agent, or Firm*—H. Donald Nelson

[57] ABSTRACT

A method of manufacturing a semiconductor wafer in a chamber having a chuck and in which temperature changes in the chamber cause residual manufacturing materials to fall onto the surface of a production wafer placed on the chuck. When the temperature of the chamber is to be changed, a protection wafer is placed on the surface of the chuck. When the temperature has been changed, the protection wafer is removed from the surface of the chuck and a production wafer is placed on the surface of the chuck and clamped. When the process is complete the production wafer is removed and the protection wafer is placed on the chuck.

2 Claims, 4 Drawing Sheets

METHOD TO MINIMIZE PARTICULATE INDUCED CLAMPING FAILURES

BACKGROUND OF THE INVENTION

1. Field of the Invention

This invention relates generally to a manufacturing process for the manufacture of semiconductor wafers. More specifically, this invention relates to a manufacturing process for the manufacture of semiconductor wafers including a method to minimize particulate induced clamping failures.

2. Discussion of the Related Art

The manufacturing process for the manufacture of semiconductor wafers includes many processes that are conducted in a chamber. The processes that are conducted in the chamber are typically conducted at different temperatures. Some of the processes conducted in the chamber are processes in which residual materials are deposited on the walls of the chamber. In many processes the wafers are held in place by placing them on an electrostatic chuck and the application of an electrical potential across the wafer and the chuck draws the wafer down to the surface of the chuck.

In the typical manufacturing process flow as shown in FIG. 1, the process steps that are to be conducted in a chamber starts as shown at 100. The temperature of the chamber is raised or lowered as required by the particular process that is to be conducted as indicated at 102. A production wafer is placed on an electrostatic chuck in the chamber as indicated at 104. The process is conducted as indicated at 106 and the production wafer is removed from the electrostatic chuck as indicated at 108 and the temperature of the chamber is raised or lowered as required for the next process as indicated at 110. The production wafer is then placed on the electrostatic chuck as indicated at 112 and the next process is conducted as shown at 114. This methodology continues until the process is finished as indicated at 116.

The problems with the prior art methodology just described are illustrated in FIGS. 2A & 2B. FIG. 2A shows a chamber 200 with an electrostatic chuck 202 in the chamber 200. The chamber 200 is undergoing a temperature change and therefore the electrostatic chuck 202 does not have a wafer clamped to it. The problem with the prior art process is that the residual materials deposited on the inside surface of the chamber have a different coefficient of expansion than the material from which the chamber is made. As the temperature of the chamber changes, the walls expand or contract causing flakes of residual material to break loose from the walls and fall on to the surface of the electrostatic chuck 202. Flakes of residual material on the walls of the chamber 200 are shown at 204 and flakes of residual material falling onto the electrostatic chuck 202 are shown at 206. Flakes on the surface of the electrostatic chuck 202 are indicated at 208. It should be appreciated that the problem associated with electrostatic chucks exist for other types of chucks on which residual flakes of material could fall and prevent a production wafer from being clamped flatly on the surface of the chuck.

FIG. 2B shows the problem caused by a flake or flakes 208 on the surface of the electrostatic chuck 202. The flake 208 prevents a wafer 210 from being completely clamped down on the surface of the electrostatic chuck 202. Because the criticality of dimensions in modem semiconductor integrated circuits, the non-flatness of the wafer 210 prevents the wafer from being properly processed. In order to rectify this situation, it is typically necessary to shut the chamber down, take the chamber out of service, open the chamber, and clean the surface of the electrostatic chuck. This cleaning process can take an entire workday because of the requirement to decrease the temperature of the chamber to a safe level and to ensure that any toxic materials will not contaminate the workplace environment.

Therefore, what is needed is a method of preventing flakes from a semiconductor-manufacturing chamber from preventing a wafer from lying flat on the surface of an electrostatic chuck in the chamber.

SUMMARY OF THE INVENTION

According to the present invention, the foregoing and other objects and advantages are attained by a method of manufacturing a semiconductor wafer that minimizes particulate induced clamping failures.

In accordance with an aspect of the invention, a protection wafer is placed on the surface of a chuck in a semiconductor-manufacturing chamber during the time the temperature of the chamber is being changed. When the temperature of the chamber has been changed, the protection wafer is removed from the surface of the chuck and a production wafer is placed on the chuck and clamped to the chuck for processing.

In accordance with another aspect of the invention, the chuck is an electrostatic chuck and the production wafer is electrostatically clamped to the chuck.

In accordance with still another aspect of the invention, the chuck is a mechanically clamped chuck and the production wafer is mechanically clamped to the surface of the chuck.

The described method thus provides a method of manufacturing a semiconductor wafer that prevents residual manufacturing materials from falling onto the surface of a chuck in a semiconductor-manufacturing chamber during temperature changes in the chamber.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention that illustrates the best mode presently contemplated by the inventors for practicing the invention. The invention is described using an electrostatic chuck, however, it should be appreciated that the invention applies to other types of chucks that can have particles falling on the surface of the chuck and that prevents production wafers from being clamped flatly on the surface of the chuck.

Figure 1:
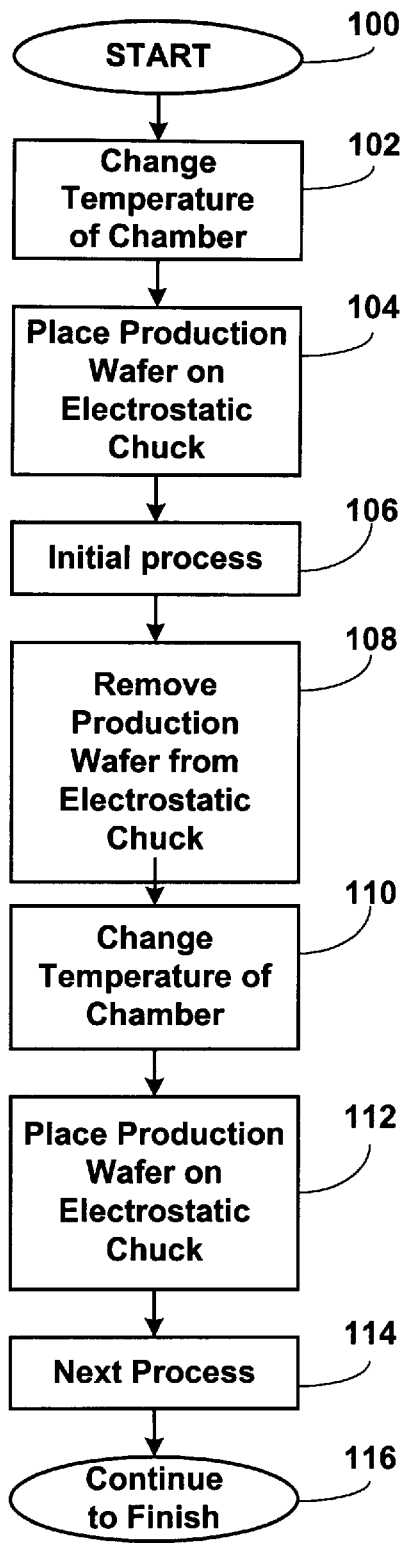
FIG. 1 is a flow diagram of a portion of a prior art semiconductor manufacturing process.
Figure 2A:
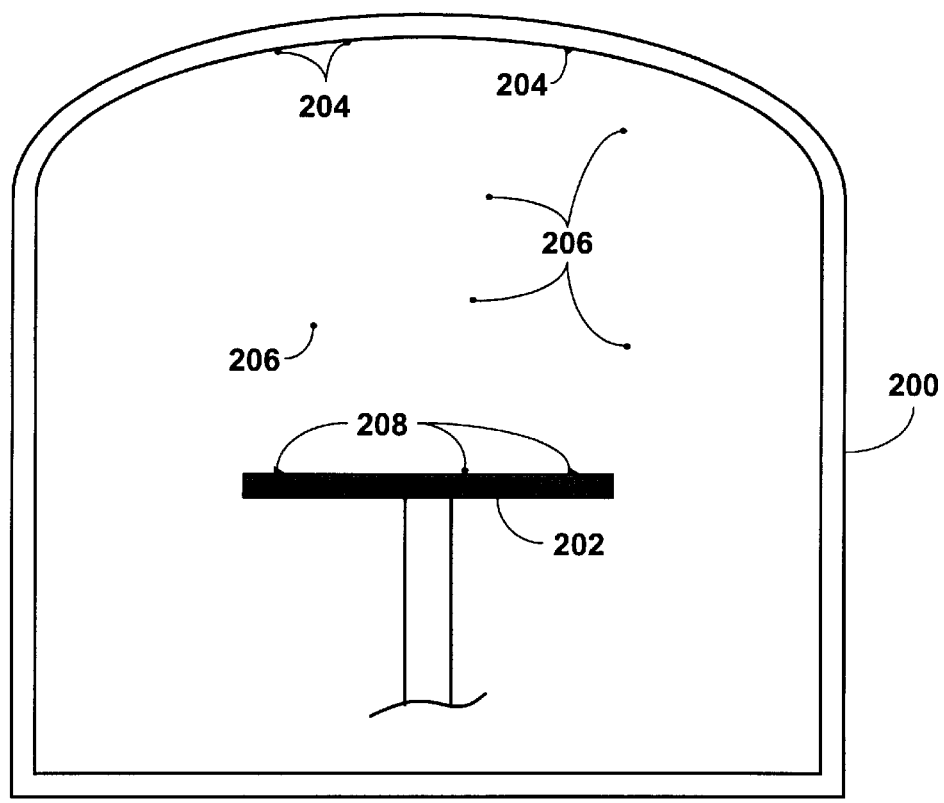
FIG. 2A shows a chamber and an electrostatic chuck.
Figure 2B:
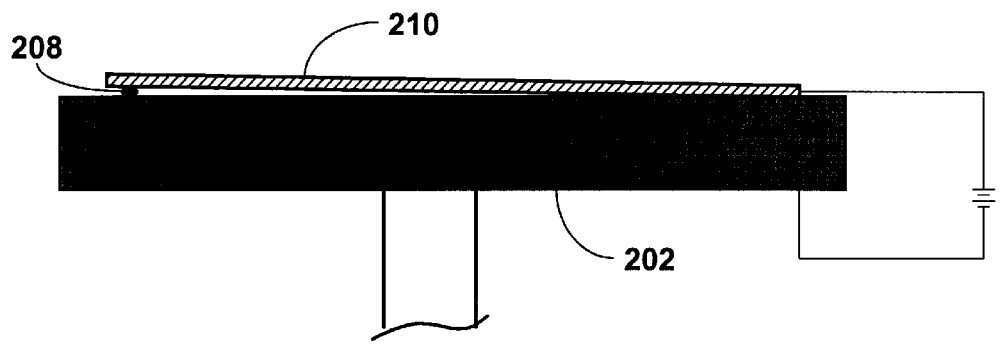
FIG. 2B shows a wafer prevented from lying flat on the surface of the electrostatic chuck by a flake broken loose from the a wall of the chamber.
Figure 3:
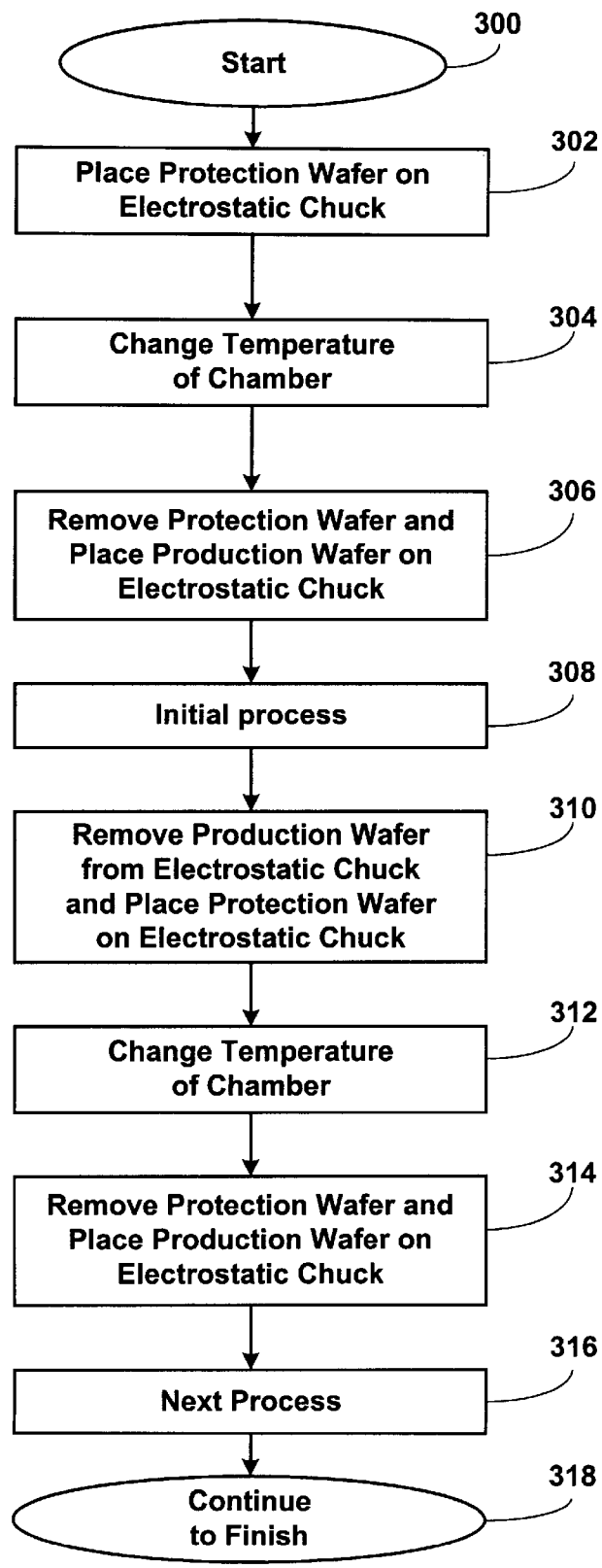
FIG. 3 is a flow diagram of a portion of a semiconductor manufacturing process in accordance with the present invention.
Figure 4A:
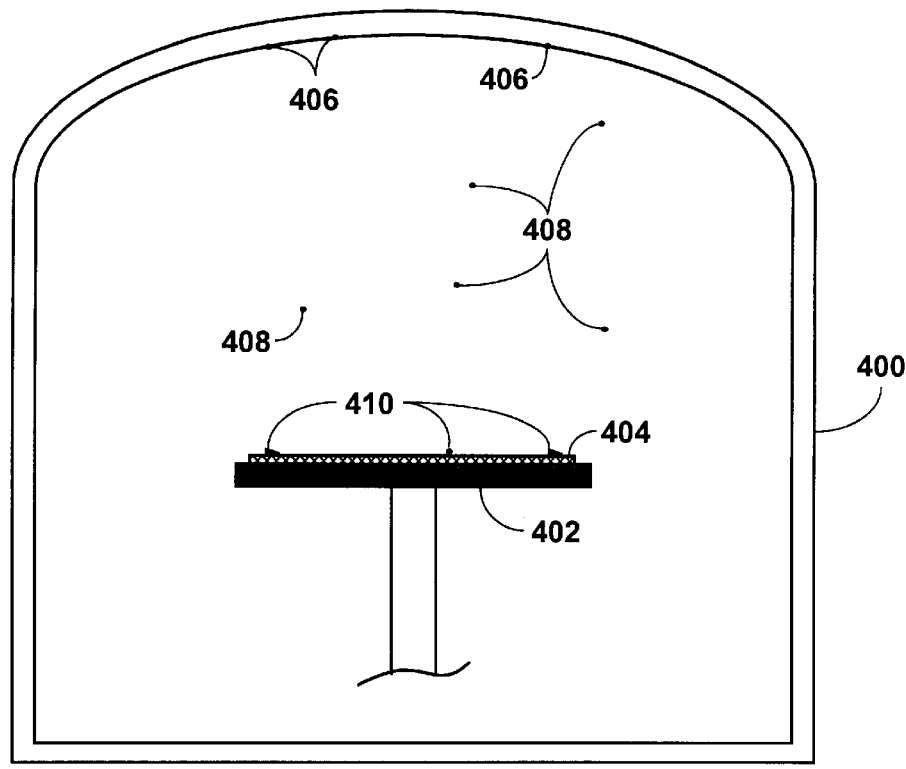
FIG. 4A shows a chamber and an electrostatic chuck with a protective wafer placed on the surface of the electrostatic chuck.
Figure 4B:
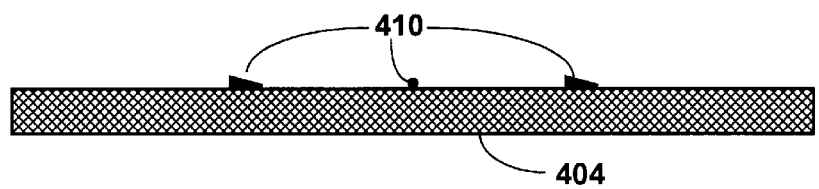
FIG. 4B shows the protective wafer removed from the surface of the electrostatic chuck showing flakes on the protective wafer that were prevented from contaminating the surface of the electrostatic chuck.
Figure 4C:
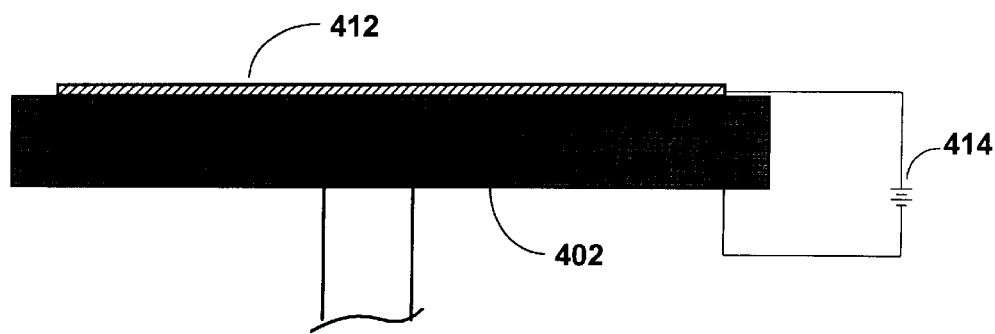
FIG. 4C shows a production wafer lying flat on the surface of the electrostatic chuck.

FIGS. 3–4C describe the methodology of the present invention. The manufacturing process flow in accordance with the present invention is shown in FIG. 3. The process steps that are to be conducted in the chamber starts as indicated at 300. A protective wafer is placed on the electrostatic chuck in the chamber as indicated at 302 and the temperature of the chamber is changed as indicated at 304. The temperature in the chamber is either increased or decreased at 304 as required by the particular process that is to be conducted on the wafer. The protective wafer is removed from the surface of the electrostatic chuck and a production wafer is placed on the electrostatic chuck and electrostatically clamped to the surface of the chuck as indicated at 306. It should be appreciated that the changing of the wafers can be done in the chamber without opening the chamber. The process is conducted at 308 and the production wafer is removed from the electrostatic chuck and the protection wafer is placed on the electrostatic chuck at 310. The temperature of the chamber at 312 is changed as required by the next process. The protection wafer is removed from the electrostatic chuck and the production wafer is place on the electrostatic chuck at 314. The next process is run at 316 and the methodology as described above continues until the wafer is finished be processed in the chamber.

Referring to FIG. 4A, there is shown a chamber 400 with an electrostatic chuck 402 in the chamber 400. The chamber 400 is undergoing a temperature change and therefore, in accordance with the present invention, has a protection wafer 404 placed on the surface of the electrostatic chuck. Flakes of residual processing materials at 406 are shown on the walls of the chamber 400 and flakes of residual processing materials at 408 are shown falling onto the protection wafer 400. Flakes on the surface of the protection wafer are shown at 410.

FIG. 4B shows the protection wafer 404 removed from the surface of the electrostatic chuck 402 along with the flakes 410 of residual processing material that has fallen from the walls of the chamber 400.

FIG. 4C shows a production wafer 412 clamped on a surface of the electrostatic chuck 402. The battery 414 indicates that a potential is applied to the wafer 412 and the electrostatic chuck 402 to clamp the wafer 412 to the chuck 402.

In summary, the results and advantages of the method of the present invention can now be more fully realized. The described method provides a method of manufacturing a semiconductor wafer in a semiconductor-manufacturing chamber that prevents residual manufacturing material particles from falling onto the surface of a chuck in the chamber during temperature changes in the chamber.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of minimizing particulate induced clamping failures by preventing particulates from contaminating wafer chucks utilized in semiconductor wafer manufacturing, the method comprising:

(a) conducting a manufacturing process on a production wafer placed on a wafer chuck in a chamber;

(b) removing the production wafer from the wafer chuck;

(c) placing a protection wafer on the wafer chuck;

(d) changing the temperature inside the chamber;

(e) removing the protection wafer from the wafer chuck;

(d) placing the production wafer on the wafer chuck; and (e) conducting the next manufacturing process on the production wafer placed on the wafer chuck in the chamber.

2. The method of claim 1 further comprising repeating steps (b) through (e) until the next manufacturing process is the last manufacturing process.

* * * * *